Nov. 25, 1958 C. PAULSON 2,861,620

DEVICE FOR ALIGNING PINS ON AN ARTICLE

Filed May 27, 1954 2 Sheets-Sheet 1

INVENTOR
C. PAULSON
BY C. B. Hamilton
ATTORNEY

Nov. 25, 1958 C. PAULSON 2,861,620

DEVICE FOR ALIGNING PINS ON AN ARTICLE

Filed May 27, 1954 2 Sheets-Sheet 2

INVENTOR
C. PAULSON
BY C. B. Hamilton
ATTORNEY

United States Patent Office 2,861,620

Patented Nov. 25, 1958

2,861,620

DEVICE FOR ALIGNING PINS ON AN ARTICLE

Christian Paulson, St. Paul, Minn., assignor to Western Electric Company, Incorporated, New York, N. Y., a corporation of New York Application May 27, 1954, Serial No. 432,727

3 Claims. (Cl. 153—32)

This invention relates to a device for aligning pins on an article and more particularly to a fixture for aligning the tuning pins on the head of a magnetron in parallel relation to each other.

An object of the invention is to provide a device for aligning pins on an article.

Another object of the invention is to provide a fixture for aligning the tuning pins on the tuning head of a magnetron in parallel relation to each other.

A device illustrating certain features of the invention for aligning in parallel relation to each other the pins on a tuning unit of a magnetron may include a holder having a seat for supporting the tuning unit and having a plurality of parallel accurately positioned cylindrical open-ended apertures therethrough of larger diameters than that of the pins for receiving the pins therein, a plurality of tubular aligning tools insertable in the tuning pin apertures for engaging the tuning pins therein and coaxially aligning them with the tuning pin apertures, means for clamping the tuning unit in aligned position in said holder whereby said aligning tools may be removed from the aligning pin apertures, and a tubular straightening tool having an outer periphery slidably engageable with the tuning pin apertures and having an eccentric bore therein engageable with the cylindrical end portion of the tuning pin therein whereby the straightening tool may be rotated through several revolutions to move the end of said pin in a circle about the axis of said tuning pin aperture to effect the straightening and coaxial alignment of the tuning pin with the tuning pin aperture.

Other objects and advantages of the invention will become apparent by reference to the following detailed description and the accompanying drawings illustrating a preferred embodiment thereof, in which Fig. 1 is a side elevational view of a tuning unit of a magnetron showing in dotted lines a transfer member associated therewith;

Figure 1:
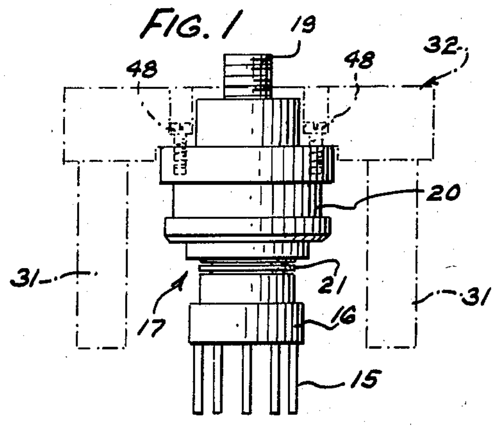
Figure 2:
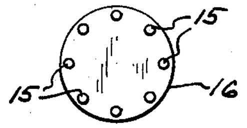
Fig. 2 is a bottom end view of the tuning unit showing the circular arrangement of the tuning pins thereon.
Figures 3, 4:
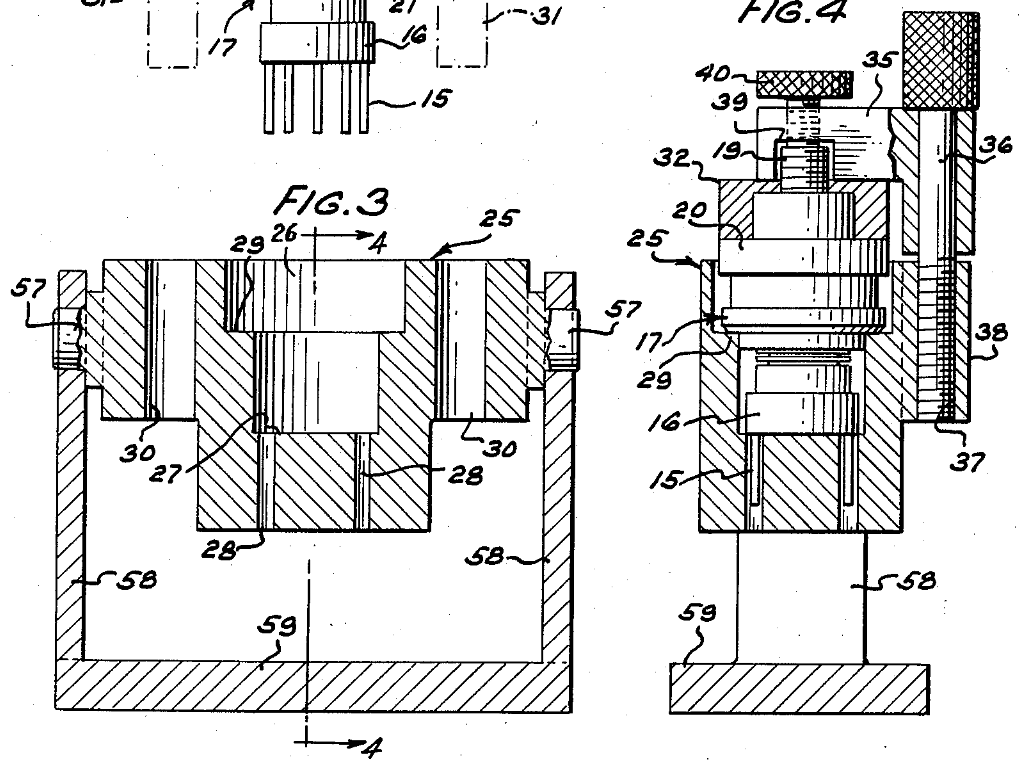
Fig. 3 is a vertical sectional view of an aligning element for receiving and holding the tuning unit during the alignment of the tuning pin thereon.
Fig. 4 is a vertical sectional view of the aligning element and holder taken on the line 4—4 of Fig. 3 and showing the tuning unit and transfer member clamped thereto.
Figure 6:
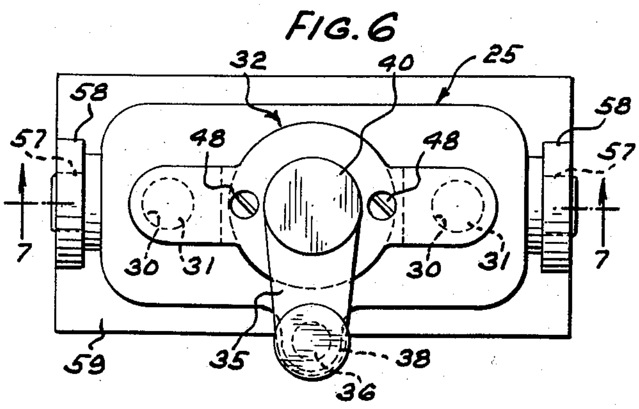
Fig. 6 is a plan view of the aligning element and holder.
Figure 5:
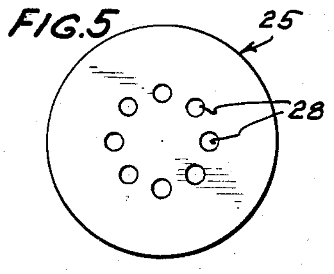
Fig. 5 is an end view of a portion of the aligning element shown in Fig. 3 and looking in the direction of the arrow 4.

The present fixture is designed for use in straightening and aligning a plurality of tuning pins 15 on a cylindrical head 16 of a tuning unit 17 of a magnetron in parallel relation to each other and the axis of the head 16. The cylindrical head 16 has a centrally disposed cylindrical stem 19 mounted for axial movement in a cylindrical member 20 which is interconnected with the head 16 by a bellows 21 bonded at its ends to the member 20 and the head 16. The tuning pins 15, which are arranged in a circle in spaced relation to each other extend from one face of the head 16 in substantially parallel relation to each other and it is necessary that they be aligned in precise parallelism to each other and the central axis of the tuning unit.

The fixtures comprises an aligning element 25 which has a central recess 26 for receiving the tuning unit therein and is provided with a seat 27 engageable with the end face of the tuning head 16 and has a plurality of open ended cylindrical tuning pin apertures 28 of larger diameter than the pins 15 for receiving the tuning pins therein. An annular shoulder 29 in the aligning element forms a seat for supporting the cylindrical member 20 thereon. A pair of cylindrical pilot apertures 30 in the element 25 disposed parallel to the axis of the apertures 28 are adapted to receive a pair of pilot pins 31 of a transfer member 32 which has a recess 33 for receiving the upper end portion of the cylindrical member 20 when the transfer member 32 is applied to the aligning element 25. Pressure may be applied to the transfer member 32 to hold the member 20 against the shoulder 29 by a clamping arm 35 pivotally mounted on the shank of a clamping screw 36 which engages a threaded aperture 37 in a boss 38 on the aligning element 25. A recess 39 in the arm 35 provides clearance for the upper end of the stem 19 and permits the arm to be oscillated about the screw 36 to and from its operative position shown in Fig. 7. A clamping screw 40 carried by the arm 35 is engageable with the end of the stem 19 and may be actuated to press the head 16 against the seat 27 of the aligning element 25.

Before the clamping screws 36 and 40 are actuated to press the members 20 and the head 16 of the tuning unit 17 against the seats 29 and 27, respectively, the tuning unit 17 and the pins 15 are aligned in a predetermined position on the aligning element 25 with the axis of the tuning pins 15 in coaxially aligned relation with the tuning pin apertures 28, after which the screws 36 and 40 may be actuated to clamp the head 16 and the member 20 on their respective seats.

Figures 7, 8, 9:
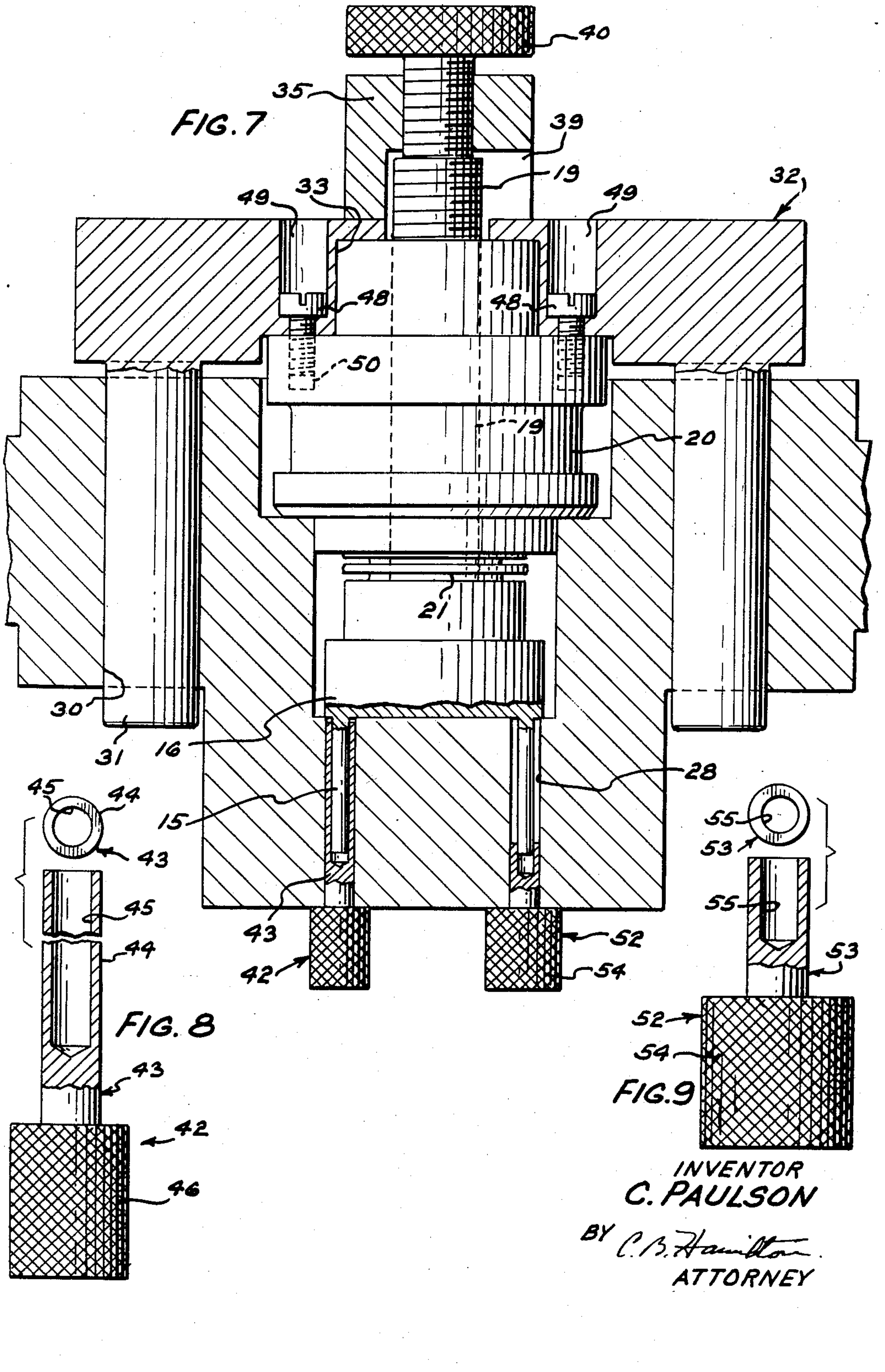
Fig. 7 is a vertical sectional view of the holder taken on the line 7—7 of Fig. 6.
Fig. 8 shows an end view and side elevational sectional view of a tubular aligning tool.
Fig. 9 shows an end view and a sectional elevational view of a straightening tool.

The alignment of the tuning unit 17 relative to the aligning element 25 is accomplished by the insertion of a plurality of tubular gages 42 in a pair of diametrically opposed pin apertures 28. Each of the gages 42 comprises a cylindrical tubular shank 43 adapted to be inserted in the pin apertures 28 and having an outer cylindrical surface 44 engageable with the cylindrical surfaces of the pin apertures 28 and having concentric inner surfaces 45 for slidably engaging the outer periphery of the tuning pins 15 to coaxially align the tuning pins 15 with the pin apertures 28. The gages 42 have enlarged heads 46 which limit the movement of the shank portion 43 into the aperture 28, the shank portion being sufficiently long to engage substantially the entire length of the tuning pin 15 as shown in Fig. 7. When two of the gages 42 are inserted in diametrically opposed pin apertures 28 in the aligning element 25 they serve to accurately align the tuning unit 17 and coaxially align the tuning pins 16 in the tuning pin apertures 28. The clamping screws 36 and 40 may then be actuated to hold the tuning unit 17 in accurately aligned position and the tuning unit 17 may then be secured to the transfer member by a pair of screws 48 fitting in recesses 49 in the transfer member 32 and engaging threaded apertures 50 in the member 20.

The ends of the tuning pins 15 are then moved in a relatively small circle concentric with the axis of the pin aperture 28 to effect the straightening and aligning of the pins in parallel relation to each other and to the axis of the head 16. The movement of the ends of the tuning pin is accomplished by a pin straightening tool 52 which has a cylindrical shank 53 and an enlarged head 54, by means of which the tool may be manipulated. The shank 53 has an outer cylindrical surface which slidably engages the inner surfaces of the pin apertures 28, and an eccentric cylindrical recess 55 which slidably engages the cylindrical end portion of the tuning pins 15 when the tool 52 is inserted in an aperture 28 as shown in Fig. 7. To facilitate the insertion of the tuning pin 15 the eccentric aperture 55 and the end of the pin 15 may be chamfered and the inner edges of the aperture 55 may be beveled.

Before the pin straightening operation, the pins 15 in magnetrons of a particular size are in substantially parallel relation to each other with the free ends thereof out of alignment various distances up to .002". It is desired that these pins be straightened to within .0005" of axial alignment. In the straightening of the pins it is necessary to bend the pin radially in the opposite direction to that in which it is bent out of alignment and to an extent greater than the distance that the free end of the pin is out of alignment, and that the distance of bending movement imparted to the pin be such that when the bending pressure is released the spring back or recovery of the pin will leave it in its proper position of alignment. It has been found that if the tool 52 has a recess 55 of .004" eccentricity and the tool is applied to a pin 15 and rotated several times and removed therefrom, the pin 15 is straightened to within .0005" of its perfect alignment. As the tool is rotated and moves the pin in a small circle about the desired axis, the pin is bent in a direction opposite from its original bent position. This bending effect work-hardens the pin and gradually increases its spring back or recovery until it equals the distance of eccentricity of the cylindrical recess 55, namely .004". Each successive turn of the tool bends the pin less and less and builds up the spring back more and more until it is fully adjusted into proper alignment.

Thus, in order to align the pins 15 of a tuning unit 17 in parallelism with each other the tuning unit is applied to the aligning element 25, the transfer member 32 is then applied thereto, tubular gages 42 are inserted in a pair of diametrically opposed pin apertures 28 to position the fixed ends of the pins 15 in coaxial alignment with the pin apertures, after which the transfer member 32 and the tuning unit 17 are clamped to the aligning fixture 25 by the clamping arm 35, and the screws 48 are applied to secure the tuning unit 17 to the transfer member 32. The pair of tubular gages 42 are then removed from the aligning fixture 25 and the straightening tool 52 is inserted in each of the pin apertures 28 in engagement with the ends of the pins 15 and rotated several times to effect the straightening of the pins into parallel relation to each other.

After the pins 15 on the tuning unit 17 have been moved into parallel relation to each other the screws 36 and 40 may be loosened and the transfer member 32 with the tuning unit 17 attached thereto may be removed from the aligning element 25 and assembled to a body component of a magnetron as described in a co-pending application on a fixture for assembling and aligning components of a magnetron, Serial No. 432,772, filed May 27, 1954.

To facilitate the manipulation of the gages 42 and the straightening tool 52, the aligning element 25 is provided with a pair of trunnions 57 and is pivotally mounted in a pair of apertured supporting brackets 58 mounted on a base 59 of the fixture, whereby the aligning element may be rotated to present the pin apertures 28 upwardly in position where they are easily accessible.

It is to be understood that the above-described arrangements are simply illustrative of the application of the principles of this invention. Numerous other arrangements may be readily devised by those skilled in the art which will embody the principles of the invention and fall within the spirit and scope thereof.

What is claimed is:

1. A fixture for aligning in parallelism a plurality of pins fixed at one end to an article comprising means for supporting the article, said supporting means having a plurality of cylindrical pin apertures positioned in parallel relation to each other and having diameters of a predetermined size larger than that of the pins for receiving the pins on said article, means for positioning the article on said supporting means with the fixed ends of the pins in coaxial alignment with said apertures, means for securing the article to said supporting means, and a tool having a cylindrical shank insertable into and rotatably supportable in the apertures of said member and having an eccentric cylindrical recess engageable with the end portions of said pins for moving the ends of the pins in a circle about the axis of the apertures.

2. A fixture for aligning in parallelism a plurality of pins fixed on one end to an article comprising means for supporting the article, said supporting means having a plurality of cylindrical pin apertures positioned in parallel relation to each other and having diameters of a predetermined size larger than that of the pins for receiving the pins on said article, means for holding the article on said supporting means with the fixed ends of the pins in coaxial alignment with said apertures, and a tool having a cylindrical portion insertable into and rotatably supportable in the apertures of said member and having an eccentric cylindrical recess engageable with the end portions of said pins for moving the ends of the pins in a circle about the axis of the apertures.

3. A fixture for aligning in parallelism a plurality of pins fixed at one end to an article comprising a member for supporting the article and having a plurality of cylindrical pin apertures positioned in parallel relation to each other and having diameters of predetermined size larger than that of the pins for receiving the pins on said article, means for positioning the article on said member with the portions of the pins adjacent the article in coaxial alignment with said apertures, means for securing the article in adjusted position on said member, and a tool having a cylindrical shank engageable with the apertures of said member and having an eccentric cylindrical recess engageable with the end portions of said pins for moving the ends of the pins in a circle about the axis of the apertures.

References Cited in the file of this patent

UNITED STATES PATENTS

| | | |
|---|---|---|
| 663,156 | Budke | Dec. 4, 1900 |
| 934,429 | Davies | Sept. 21, 1909 |
| 1,182,658 | Dolles | May 9, 1916 |
| 1,504,024 | Clark | Aug. 5, 1924 |
| 2,389,885 | Anderson | Nov. 27, 1945 |
| 2,573,198 | Hoffman et al. | Oct. 30, 1951 |
| 2,609,858 | Engel | Sept. 9, 1953 |
| 2,696,746 | Hoffman et al. | Dec. 14, 1954 |